United States Patent
Steudel et al.

(10) Patent No.: US 11,005,016 B2
(45) Date of Patent: May 11, 2021

(54) APEX ANGLE REDUCTION IN A LED DEVICE WITH A LED ARRAY

(71) Applicant: IMEC VZW, Leuven (BE)

(72) Inventors: Soeren Steudel, Oud-Heverlee (BE); Zsolt Tokei, Leuven (BE); Paul Heremans, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/706,002

(22) Filed: Dec. 6, 2019

(65) Prior Publication Data
US 2020/0185579 A1   Jun. 11, 2020

(30) Foreign Application Priority Data
Dec. 10, 2018   (EP) .................................... 18211303

(51) Int. Cl.
*H01L 33/58* (2010.01)
*H01L 27/15* (2006.01)
*H01L 33/62* (2010.01)

(52) U.S. Cl.
CPC ............ *H01L 33/58* (2013.01); *H01L 27/156* (2013.01); *H01L 33/62* (2013.01); *H01L 2933/0058* (2013.01); *H01L 2933/0066* (2013.01)

(58) Field of Classification Search
CPC ....... H01L 33/58; H01L 27/156; H01L 33/62; H01L 2933/0058; H01L 2933/0066; H01L 25/167; H01L 33/42; H01L 25/0753
See application file for complete search history.

(56) References Cited

U.S. PATENT DOCUMENTS

| | | | |
|---|---|---|---|
| 8,721,128 B2 * | 5/2014 | Daijo ................... | G02B 17/086 362/308 |
| 2006/0186547 A1 | 8/2006 | Wang et al. | |
| 2008/0251874 A1 | 10/2008 | Ishibe | |
| 2009/0244922 A1 * | 10/2009 | Hayakawa ........... | G02B 6/0006 362/555 |
| 2011/0037134 A1 | 2/2011 | Sugino et al. | |
| 2015/0108525 A1 * | 4/2015 | Chae ...................... | H01L 33/06 257/98 |

(Continued)

FOREIGN PATENT DOCUMENTS

EP   3410479 A1   12/2018

OTHER PUBLICATIONS

European Search Report, European Patent Application No. 18211303. 5, dated Jun. 4, 2019, 9 pages.

*Primary Examiner* — Victor A Mandala
(74) *Attorney, Agent, or Firm* — McDonnell Boehnen Hulbert & Berghoff LLP

(57) ABSTRACT

A Light Emitting Diode (LED) device, particularly a micro-LED (μLED) device, suitable for a μLED display is described. The LED device comprises a LED array with a plurality of LEDs 12. It also comprises at least one top contact and bottom contact electrically connected to the LED array. Further, it comprises a conductive structure arranged above the LED array and the top contact, respectively, and electrically connected to the top contact. The conductive structure is, regarding each LED of the LED array, configured to absorb a first part of the light emitted by the LED, and to pass a second part of the light emitted by the LED. An emission angle (beam angle) of the passed light is thereby smaller than an emission angle of the light emitted by the LED.

18 Claims, 5 Drawing Sheets

(56) References Cited

U.S. PATENT DOCUMENTS

| | | | |
|---|---|---|---|
| 2015/0362165 A1* | 12/2015 | Chu | H01L 27/156 |
| | | | 362/235 |
| 2017/0077165 A1 | 3/2017 | Kimura | |
| 2017/0294424 A1* | 10/2017 | Jeong | H01L 25/0753 |
| 2018/0031752 A1* | 2/2018 | Ferrini | G02B 6/0016 |
| 2018/0151615 A1 | 5/2018 | Wen et al. | |
| 2019/0254510 A1* | 8/2019 | Onobori | G02B 23/2461 |
| 2019/0326486 A1* | 10/2019 | Ting | H01L 33/54 |
| 2019/0348582 A1* | 11/2019 | Huang | H01L 33/58 |
| 2020/0111939 A1* | 4/2020 | Brodoceanu | H01L 21/67144 |

\* cited by examiner

APEX ANGLE REDUCTION IN A LED DEVICE WITH A LED ARRAY

CROSS-REFERENCE TO RELATED APPLICATIONS

The present application is a non-provisional patent application claiming priority to European Patent Application No. EP 18211303.5, filed Dec. 10, 2018, the contents of which are hereby incorporated by reference.

FIELD OF THE DISCLOSURE

The disclosure relates to the technical field of Light Emitting Diode (LED) devices, particularly of micro-LED (μLED) devices. The disclosure presents an LED device with an LED array, particularly with a μLED array having a LED pixel pitch in the μm range. An emission angle of the light provided by the LED device is reduced compared to an emission angle of the light output from the LED array. Thus, the LED device of the disclosure is well applicable to μLED displays as, for instance, used in augmented reality (AR) glasses.

BACKGROUND

The emission angle (also referred to as the "beam angle" or "APEX angle") of light emitted by a light source—e.g. a LED device or array—is the opening angle of the emitted "light beam" or "light cone". The emission angle is particularly defined as the angle between the two emission directions, for which the luminous intensity is reduced to 50% of the luminous intensity along a main emission axis/direction of the light source. For rotational symmetric beams, the emission angle is thus twice a certain angle with respect to the main emission axis (also referred to as the "optical axis"), at which the luminous intensity is reduced to 50% of the luminous intensity along the main emission axis. The main emission axis is the direction into which the light source emits the highest relative luminous intensity.

The emission angle of light emitted by a conventional μLED array in a LED device is typically between 110-160°. Outside of this rather wide emission angle, the light intensity is significantly reduced or lost, e.g. due to internal reflections.

However, in order to use a LED device with a μLED array in e.g. a μLED display, the emission angle of the light it emits should be much narrower than the above-mentioned emission angle of the conventional μLED array. In particular, the light emission angle of such a LED device should ideally be around 50° or less, in order to allow collimation of the emitted light into, for example, a waveguide.

To reduce the emission angle of a conventional μLED array towards this narrow target specification, in principle a diaphragm or optical lens could be used to collimate the light. However, due to the strict size limitations in a LED device with a μLED array, for instance, for the LED pixel pitch being in the μm range, and in view of the ongoing efforts to scale down further this pixel pitch, the design of a diaphragm or lens for such a LED device is very challenging. As of now, no satisfying solution for a LED device with a LED array is available.

Another challenge for a LED device including a conventional μLED array is that the smaller the LED pixel pitch is or becomes, the more difficult it is to provide for an efficient current and heat distribution in the device.

SUMMARY

In view of the above-mentioned challenges, at least some of the example embodiments aim to improve conventional LED devices with LED arrays, particularly with μLED arrays, and their fabrication process. One or more of the example embodiments provide a LED device, which emits light with a narrow emission angle. The emission angle should be narrow enough to allow for an efficient collimation and coupling of the light into, for instance, a waveguide. The emission angle of the LED device should especially be well below the emission angle of a conventional μLED array.

Moreover, at least some of the example embodiments provide for very small LED pixel pitches, i.e. in the low μm range. In addition, an efficient heat and current distribution should also be provided in the LED device, particularly in its LED array. Another goal is to fabricate the LED device very compactly, and with an efficient fabrication process that allows reaching high yields.

In a first implementation, a LED device is provided. The LED comprises: a LED array including a plurality of LEDs, at least one top contact and bottom contact electrically connected to the LED array, and a conductive structure arranged above the LED array and the top contact, respectively, and electrically connected to the top contact, wherein the conductive structure is, regarding each LED, configured to absorb a first part of the light emitted by the LED, and to pass a second part of the light emitted by the LED, wherein an emission angle of the passed light is smaller than an emission angle of the light emitted by the LED.

The conductive structure may be configured like this with respect to each single LED in the LED array. An emission angle of the passed light being smaller than an emission angle of the light emitted by the LED means the same as that the conductive structure is configured to pass the light emitted by the LED as a collimate beam.

In particular, the conductive structure may be configured to absorb the first part of the LED light by having an absorptive surface or at least an absorptive surface region arranged in the light path. The conductive structure may further be configured to pass the second part of the LED light by having an opening arranged above the LED and transparent at least to the light emitted by the LED. The conductive structure may particularly be arranged such with respect to the LED beneath it, that the beam angle of the light passing through the opening is narrowed compared to the beam angle of the LED light. That is, the conductive structure serves as a diaphragm. This may be achieved by properly designing the width and height of the conductive structure, and the width or diameter of the openings in the conductive structure.

Each LED of the LED array is configured to emit light along a certain main emission axis and with a certain emission angle (which is symmetrically around the main emission axis). That is, each LED is configured to output a light beam or light cone with the emission angle being its (APEX) opening angle. For instance, the emission angle of each LED, and thus also of the LED array as a whole, may be between 110-160° (i.e. before the conductive structure and without any optical elements acting on the light).

The conductive structure may absorb LED light that impinges on it (first part), while it lets the remaining LED light (second part) pass through. Because the LED light has a smaller beam angle after passing the conductive structure than before passing it, an APEX reduction of the emitted light is achieved in the LED device. Notably, the emission angle of the passed light may be the emission angle of the light output by the LED device as a whole, if the passed light is not affected anymore by any further optical element of the LED device.

In some embodiments, the conductive structure may provide a twofold purpose in the LED device. On the one hand, it serves as the diaphragm arranged above the LED array, as described above. On the other hand, since it is electrically connected to the at least one top contact, it can be used to provide a current or voltage to the LED array. In particular, it thus enables an efficient current distribution. Furthermore, it also provides for an efficient heat distribution during operation of the LED device.

As a consequence, the LED device of the first implementation is particularly suited for being used in a top emission μLED display.

Notably, as already described generally above, the main emission axis (optical axis) of each LED of the LED device is the axis, into which that LED emits the highest relative luminous intensity. This optical axis may be perpendicular to the LED surface, the LED layers and/or particularly to an active area, e.g. a quantum well layer, of the LED. The LED, however, also emits light into directions deviating from the main emission axis, however, at lower relative luminous intensity. At two certain angles from the main emission axis (in opposite angular directions from the main emission axis), the luminous intensity of the emitted light drops to 50%. The two certain angles determine the emission angle (beam angle) of the light emitted by the LED, namely the emission angle of the light emitted by the LED is the sum of these certain angles (and is twice the same certain angle for a rotational symmetric beam).

The emission angle (beam angle) of the passed light may be determined likewise. That is, the light of a certain LED passes the conductive structure with a certain main emission axis, in which the passed light has the highest relative luminous intensity. This main emission axis of the passed light typically, but not necessarily, coincides with the main emission axis of the LED. The emission angle of the passed light is defined by the sum of the angles from the main emission axis of the passed light to opposite sides thereof, at which the luminous intensity of the passed light drops to 50%. If the passed light is rotation symmetric the emission angle is twice the same angle from the main emission axis to each side, at which the passed light drops to 50%.

The at least one top contact electrically contacts the LEDs of the LED array from above. For instance, each LED may be contacted by a single top contact provided on its top surface. A common top contact can cover the top surface of multiple LEDs or all LEDs. The at least one bottom contact contacts each LED from below. For instance, each LED may be contacted by one single bottom contact from below.

In one respect, the conductive structure and the at least one top contact are separate structures. In another respect, however, together they may be considered to form a top contact structure in the LED device for contacting the LED array.

The terms "above" and "below" relate to the orientation of the LEDs and particularly the light emission axis/direction of the LED array. "Above" or "top" is the side where the LED array emits light. "Below" or "bottom" is the opposite side. Any element referred to as being "below" the LEDs or the LED array does thus not interfere with the emitting of the LED light.

In at least some embodiments of the LED device, the emission angle of the passed light is an angle of 60° or less, particularly is an angle of 40-50°.

Thus, the emission angle of the LED device becomes narrow enough—even without any further optical elements—to be well coupled into a waveguide or the like. Accordingly, the LED device is well suited for application in a μLED display.

In at least some embodiments of the LED device, the LED device further comprises a plurality of lenses arranged above the conductive structure, wherein each lens is configured to focus the light that is emitted by one of the plurality of LEDs and is passed by the conductive structure.

In at least some of the aforementioned embodiments, the emission angle of the passed light, i.e. after the conductive structure, may be larger than described above. For instance, the emission angle of the passed light may be an angle above 60°, or even an angle above 100°, since the lens provided for each LED above the conductive structure further narrows the beam of the passed light. That is, an emission angle of the focused light is smaller than the emission angle of the passed light. The emission angle of the focused light may in this case be the emission angle of the light output by the LED device as a whole, if the light coming from the lenses is not influenced anymore by any further optical element of the LED device. The lenses may be microlenses, reflow lenses, and/or refractive lenses.

If the emission angle of the passed light is an angle between 60-100°, as described above, the emission angle of the focused light may an angle below 60°, e.g. an angle between 40-50°. In this way, the dimensions of the conductive structure, which lead to the emission angle reduction regarding each of the LEDs, can be designed larger, thus processing of it becomes simpler.

If the emission angle of the passed light is already an angle below 60°, as also described above, the emission angle of the focused light may be an angle below 40°, e.g. an angle between 25-40°. In this way, an even narrower emission angle of the LED device as a whole becomes possible.

In at least some embodiments of the LED device, the LED device further comprises a plurality of lenses arranged between the LED array and the conductive structure, wherein each lens is configured to focus at least some of the light emitted by one of the plurality of LEDs, so that the focused light is passed by the conductive structure.

In particular, each of these lenses may focus at least some light of the LED, which the conductive structure would otherwise be arranged and configured to absorb, i.e. without the lens being present. While the emission angle of the passed light, i.e. after the conductive structure, may still be defined primarily by the dimensions and the arrangement of the conductive structure with respect to the LED—and not by the lens arranged regarding this LED between the LED array and the conductive structure—the total intensity of the passed light may be increased. The lenses may be microlenses, reflow lenses, and/or refractive lenses. The lenses may be arranged below the conductive structure, but above the LED array and top contact, respectively. However, the lenses may also be arranged above a lower end of the conductive structure but below an upper end of the conductive structure, i.e. within the height of the conductive structure.

The lenses may alternatively be diffractive lenses, in which case the lenses do not focus but widen the light coming from the LEDs. In this case, the conductive structure may be configured to reflect at least some of the widened light such that it passes the conductive structure. For this, the conductive structure may be provided with a reflective surface at least in determined surface regions.

In at least some embodiments of the LED device, the conductive structure comprises a light-absorbing layer to absorb light emitted by the plurality of LEDs, particularly a carbon layer or a layer of a high refractive index material.

The light-absorbing layer may be disposed onto the outer surface of a conductive core of the conductive structure, at least onto determined surface regions arranged in the path of LED light that is to be removed. However, also the complete surface of the core of the conductive structure may be coated with such an absorbing layer. In this way, the conductive structure may be configured to absorb the first part of the light emitted by each LED, in order to reduce the emission angle. For instance, when considering a central point of light emission in the LED active area, i.e. the point in the LED active area through which the optical axis of the LED extends, light emitted from this point at angles below a determined angle may pass the conductive structure, while light emitted from this point above a determined angle may be absorbed by the conductive structure. For the light emitted from this point, the emission angle is thus narrowed.

A carbon layer is simply very black and is thus absorptive. A high refractive index material (e.g. ALD $Al_2O_3$) will let light coming from the LED pass (due to the refractive index change), but the light will reflect at the core of the conductive structure and cannot anymore pass the high refractive index material in the opposite direction. Thus, the light enters the layer of the high refractive index material, where it is trapped.

In at least some embodiments of the LED device, the LED device further comprises a transparent top contact connected to several or each of the plurality of LEDs and arranged between the LED array and the conductive structure.

That is, the transparent top contact is a common top contact, common to at least some of the LEDs. The top contact is particularly transparent to the LED light. The common top contact simplifies the processing of the LED device, and allows designing a smaller LED array with an optimized overall area occupied by LED surface (aperture).

In at least some embodiments of the LED device, the conductive structure is connected to determined regions of a top surface of the top contact, the determined regions being positioned above the spaces between adjacent LEDs.

In particular, the determined regions may be only positioned above the spaces between the LEDs, not above the LEDs themselves. Accordingly, the determined regions may be aligned with the spaces when the LED device is viewed in a top view, i.e. from above. In other words, the conductive structure as a whole is put on the top contact such that it follows the spaces between the multiple LEDs beneath the top contact. In this way, the conductive structure is able to contact the top contact, to serve as a diaphragm for each of the LEDs, and to separate the light coming from different LEDs.

In at least some embodiments of the LED device, the conductive structure comprises a plurality of transparent openings, each transparent opening being related to one of the plurality of LEDs.

In particular, each transparent opening may be arranged above the LED it is related to. "Transparent" opening means that the opening is configured to pass at least the light of interest emitted by the LED it is related to. The transparent openings can be realized with a transparent material being embedded into cavities of the conductive structure and located above the LEDs. The transparent openings may filter electromagnetic radiation other than the light of interest of the LEDs.

In at least some embodiments of the LED device, the conductive structure comprises a plurality of vertical posts, the vertical posts being positioned above the spaces between the plurality of LEDs and configured to separate adjacent LEDs from each other.

In particular, the vertical posts are aligned with the contours of the LEDs in a top view of the LED device. Each LED may be surrounded by one or more vertical posts, in the top view. The vertical posts may have an absorptive surface facing the LEDs, or may at least absorptive regions on that surface. The vertical posts separate adjacent LEDs from each other with respect to the light emitted by each LED being separated.

In at least some embodiments of the LED device, an upper surface of the conductive structure defines the transparent openings and is located at a determined distance above the LED array.

The determined distance and a size (e.g. a width or diameter) of each an opening determines with respect to an LED, how strong the reduction of the emission angle of the passed light is with respect to the light emitted by this LED.

In at least some embodiments of the LED device, the LED array has a LED pixel pitch between 1-10 µm, in particular equal to or below 3 µm, and/or a height of the conductive structure is between 0.1-1 times, in particular between 0.5-0.8 times, a LED pixel pitch of the LED array.

Thus, the LED array is particularly a µLED array. The LEDs in this array can be placed closely together, thus allowing a very compact LED device but with maximized LED apertures. The height of the conductive structure is in the range of the LED pixel pitch, and thus works well as the diaphragm.

In at least some embodiments of the LED device, the conductive structure comprises a metallic core, particularly a copper core, and is embedded in a dielectric material.

Accordingly, the conductive structure may be a damascene-processed structure, i.e. may be produced by using a damascene process. In particular, this may be a damascene copper (Cu) process and/or a dual-damascene process. Alternatively it can be a tungsten (W) damascene process or ruthenium (Ru) damascene process as well. The dielectric is preferably transparent for the LED light. By using a damascene process, the conductive structure can be made in one process step, and can be made such that it serves as a highly conductive metallization grid for efficient current and heat distribution in the LED device, and serves as the diaphragm reducing the emission angle of the LED light.

In at least some other embodiments, the LED device further comprises a plurality of bottom contacts, wherein each bottom contact is electrically connected to one of the plurality of LEDs, and a CMOS IC connected through the bottom contacts to the LEDs and configured to drive the LED array.

The CMOS IC may also be configured to readout the LED array. The CMOS IC may include an active matrix of logical elements, one associated with each LED of the LED array. One bottom contact per LED is provided below the LED array. The CMOS IC may be provided directly beneath the bottom contacts, i.e. close to the LED array.

In at least some other embodiments of the LED device, the LED device is an integrated LED chip or wafer, wherein particularly the LED array, the at least one top and bottom contact and the conductive structure are integrated.

In particular, even a monolithic integration of the LED device, particularly the mentioned elements, is possible. The LED device can thus be fabricated in a very compact manner and with an efficient process.

In a second implementation, a method for fabricating a LED device is provided. The method comprises: processing a LED array including a plurality of LEDs, processing at least one top contact and bottom contact electrically connected to the LED array, and processing, particularly with a damascene process, a conductive structure arranged above the LED array and the top contact, respectively, and electrically connected to the top contact, wherein the conductive structure is, regarding each LED, configured to absorb a first part of the light emitted by the LED, and to pass a second part of the light emitted by the LED, wherein an emission angle of the passed light is smaller than an emission angle of the light emitted by the LED.

The conductive structure can either be a single-layer structure or a dual-layer structure (when fabricated in a dual-damascene process), wherein at least one of these layers is configured to absorb the first part of the light, for instance, by being provided with an anti-reflective coating.

The method of the second aspect may be developed in embodiments according to the embodiments described for the LED device of the first implementation.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
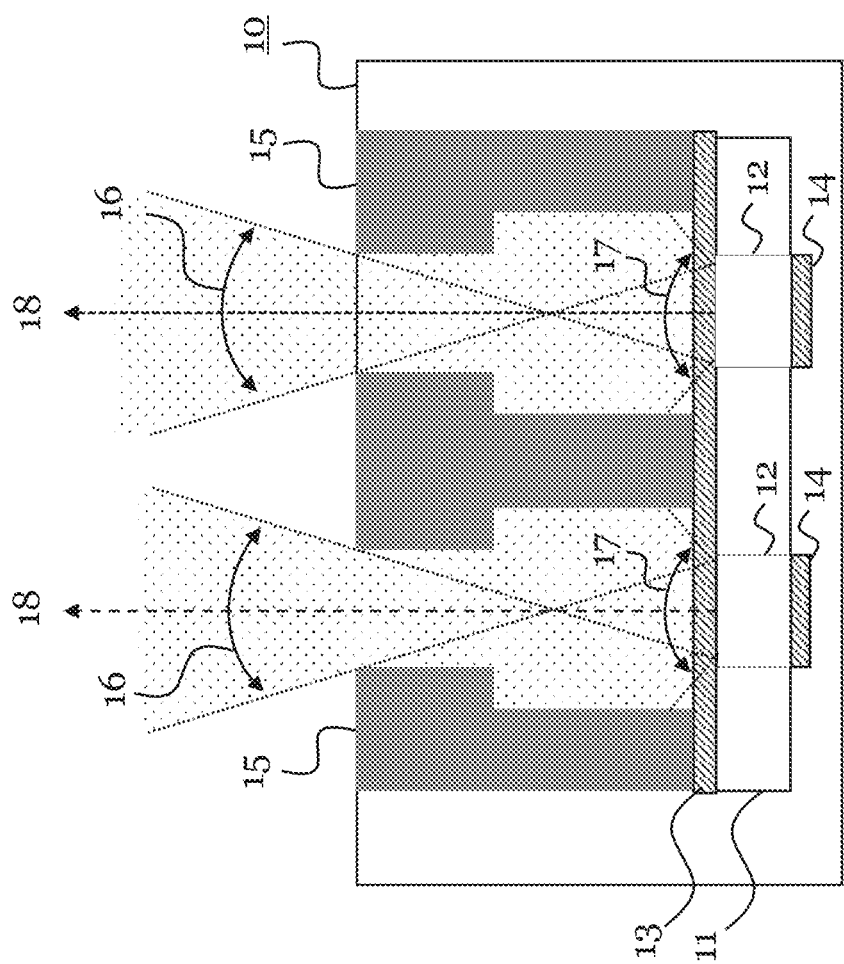
FIG. 1 shows a LED device according to an example embodiment. As an example, the embodiment can include a LED device with a conductive structure arranged above an LED array.

FIG. 1 shows a LED device 10 according to an example embodiment. The LED device 10 may particularly be a μLED device, which is suitable for being used in a μLED display. The LED device 10 may be an integrated chip or wafer, e.g. monolithically integrated.

The LED device comprises a LED array 11, particularly a μLED array, which includes a plurality of LEDs 12. The LEDs 12 of the LED array 11 may, for example, be arranged in rows and/or columns, or in any other two-dimensional pattern. An LED pixel pitch, i.e. a center-to-center distance between adjacent LEDs 12 (i.e. the sum of LED width/diameter and the space between adjacent LEDs 12) may be in the μm range, particularly may be equal to or below 3 μm. Each LED 12 of the LED array 11 is configured to emit light, wherein an emission angle 17 of the emitted LED light may be between 110°-160°. That means, each LED 12 can emit light with a certain beam angle 17. The emission angle 17 of each LED 12 is preferably similar or equal. Due to the close arrangement of the LEDs 12, an emission angle of the light emitted by the LED array 11 as a whole is the same as the emission angle 17.

Further, the LED device 10 includes at least one top contact 13 electrically connected to the LED array 11 from above, and at least one bottom contact 14 electrically connected to the LED array from below. "Above" and "below" are defined along the main emission axis 18 of each LED 12 (parallel to the vertical direction in FIG. 1), wherein it is assumed that the main emission axes 18 of the LEDs 12 are parallel. Each LED 12 is contacted by at least one top contact 13 and bottom contact 14, and when a sufficient voltage is applied between these two contacts 13 and 14, the LED 12 emits the light. Each LED 12 may have its own top contact 13 and/or its own bottom contact 14, but also common contacts can be applied to several LEDs 12 or even all of the LEDs 12 in the LED array 11. The at least one top contact 13 may particularly made of a transparent conductive material, for instance: Indium Tin Oxide (ITO), highly-doped n-GaN, or highly-doped p-GaN.

Notably, there is no vertical interconnect access (via) or any other electrical connection element through the LED array 11 and between the LEDs 12. In this way, the LED pixel pitch equal to or smaller than 3 μm can be achieved, while the optical apertures of the LEDs 12 can be maximized, i.e. the LED surfaces occupy as much area of the LED array 11 as possible.

The LED device 10 further comprises a conductive structure 15, which is arranged above the LED array 11 and above the at least one top contact 13, respectively. The conductive structure 15 is electrically connected to the top contact 13. Thus, it can be used to provide current to the LED array 11, and also serves as heat distributor during operation of the LEDs 112. In particular, the conductive structure 15 is provided on the top contact 13, at least on dedicated regions of its top surface, particularly regions of the top surface of the top contact 13, which are positioned above the spaces between adjacent LEDs 12 in the LED array 11 below the top contact 13.

The conductive structure 15 is further configured to act as a diaphragm for the LED array 11, particularly for each LED 12, in order to narrow the emission angle regarding each LED 12 and thus of the LED array 11 as a whole. To this end, the conductive structure 15 is dimensioned, arranged and configured, regarding each of the LEDs 12, such that—in operation of the LED device 10—it absorbs a first part of the light emitted by the LED 12, and passes a second part of light emitted by the LED 12. The first part that is absorbed is light emitted by the LED 12 hitting an absorptive surface or surface region of the conductive structure 15, and the second part that is passed is light emitted by the LED 12 that does not hit the conductive structure 15, because it goes through a dedicated opening in the conductive structure 15. Thereby, an emission angle 16 of the passed light, i.e. after the conductive structure 15, is smaller than the emission angle 17 of the light emitted by the LED 12, i.e. before the conductive structure. Accordingly an APEX reduction per LED 12 is achieved.

FIG. 1 illustrates schematically, how the conductive structure 15 is configured to output/pass light, regarding each of the LEDs 12, with the narrowed emission angle 16. The LED 12 emits light primarily along the main emission axis 18, but with the emission angle 17, which symmetrically centers the main emission axis 18. The LED 12, particularly an active area thereof, like a quantum well, has a certain finite width/diameter as seen in FIG. 1. The width of the LED 12 may be in the order of the dimensions of the conductive structure 15. For example, a height of the conductive structure 15 may be between 0.5-0.8 times the LED pixel pitch of the LED array 11, and may thereby be equal to the width/diameter of the LED 12. Each point of the active area of the LED 12 emits light, due to carrier recombination, and each emission is assumed to have the same emission angle 17.

The conductive structure is 15 now placed such with the respect to each LED 12 that it forms an opening over the LED 12. For instance, the optical axis 18 of the LED 12 may be centered in the corresponding opening of the conductive structure 15. Accordingly, light emitted along the optical axis 18 may pass the conductive structure 15. However, also light not emitted along the optical axis 18 may be able to pass the conductive structure 15, as indicated by the dotted lines originating from the two opposite edges of the LEDs 12. The emission angle 16 of the light passed by the conductive structure 15 is defined by basic geometrical considerations.

The opening related to each LED 12 should to have a certain diameter/width, and should be arranged at a certain distance above the LED 12. These parameters depend on the emission angle 17 of the LED 12, the width of the LED 12, the desired emission angle 16 of the passed light, and on each other. The latter means that a wider opening of the conductive structure 15 may be used for a higher conductive structure 15, i.e. for a larger distance between the opening and the LED 12.

In an example, the emission angle 17 of the LED 12 is between 110-160°, while the emission angle 16 of the passed light is below 60°, particularly is between 40-50°. However, the value of the emission angle 16 of the passed light can be adjusted by adjusting the dimensions (e.g. height, opening width/diameter, LED-opening-distance) of the conductive structure 15 and/or its arrangement with respect to the LED array 11.

Figure 2:
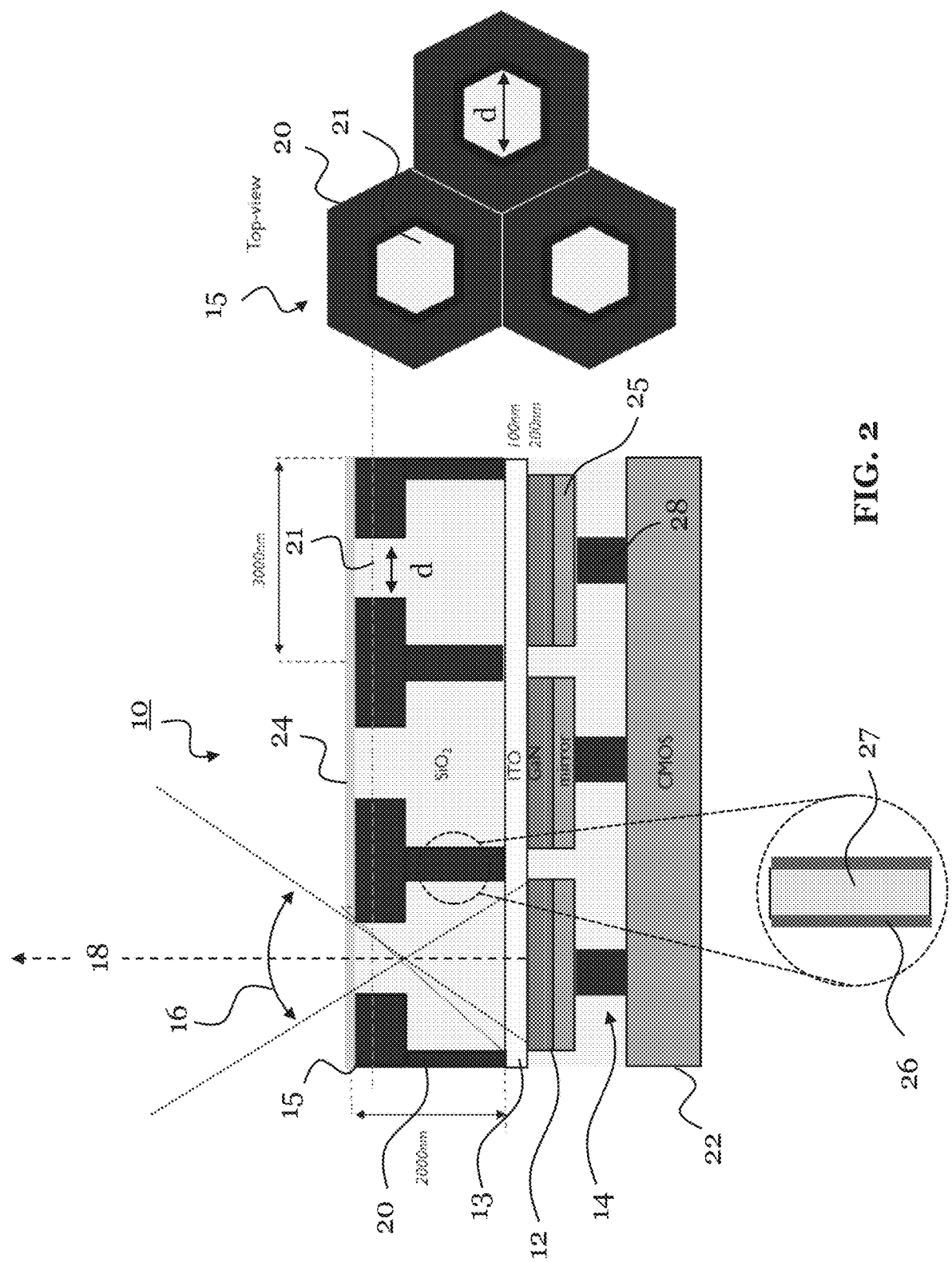
FIG. 2 shows a LED device according to an example embodiment. As an example, the embodiment can include an LED device in which the conductive structure is fabricated by a damascene process.

FIG. 2 shows an LED device 10 according to an example embodiment, which builds on the LED device 10 shown in FIG. 1. Particularly, the LED device 10 is show in a side-view/cross section (left side) and in a top view (right side). Same elements in FIG. 1 and FIG. 2 share the same reference signs and function likewise. Also the LED device 10 of FIG. 2 comprises the LED array 11, the top and bottom contacts 13 and 14, respectively, and the conductive structure 15.

FIG. 2 shows particularly an LED device 10, in which a damascene process was used to fabricate the conductive structure 15. The damascene process can be similar to one used in M10-M14 in advanced logic processes. Accordingly, the conductive structure 15 may comprise a metallic core, particularly a Cu core, if a Cu-damascene process is used, and may be embedded in a dielectric material 24, which is here selected to be $SiO_2$. The dielectric material 24 is particularly transparent for the light of the LED array 11. The use of the damascene process allows creating a high aspect ratio conductive structure 15, which is beneficial for sheet resistance, but at the same time for the function of a diaphragm.

As shown in the enlarged section of FIG. 2, the conductive structure 15 may further comprise a light absorbing layer 26, i.e. an anti-reflective layer, configured to absorb light emitted by the plurality of LEDs 12 and impinging on the surface of the conductive structure 15, i.e. absorb the first part of the light. An example for such an anti-reflective layer is a (black) carbon layer, particularly a PECVD C layer (with a thickness of e.g. 5-50 nm), or a layer of a high refractive index material to trap light (e.g. ALD $Al_2O_3$). The absorbing layer 26 may be provided, e.g. grown, sputtered, or dispensed, or the like, onto an outer surface of a conductive core 27 of the conductive structure 15, or at least onto regions of that core surface. Thus, an absorptive surface or absorptive surface regions of the conductive structure 15 are formed.

The conductive structure 15 may be positioned on a transparent common top contact 13 (shown to be ITO, but it can also be highly doped n-GaN or p-GaN). As shown in the top view of FIG. 2, the conductive structure 15 may be shaped grid-like—e.g. as a grid forming a honeycomb pattern—and may follow the contours of the plurality of LEDs 12 arranged beneath it (when viewed in the top view). The conductive structure 15 may define also a plurality of transparent openings 21 located at a certain distance above the LEDs 12, each opening 21 being related to one of the plurality of LEDs 12. The conductive structure 15 may particularly be formed by a plurality of vertical posts 20, the vertical posts 20 being positioned above the spaces between the plurality of LEDs 12, in order to separate each LED 12 from its adjacent LEDs 12 in the LED array 11. Above the vertical posts 20, the transparent openings 21 may be defined, one opening 21 related to and arranged above each LED 12. One or more vertical post 20 may together be arranged around one of the LEDs 12 in a top view, that is, may follow the outer contours of an LED 12. Thus, the conductive structure 15 helps guaranteeing a uniform current distribution and also avoiding optical cross talk between different LED pixels, i.e. between adjacent LEDs 12. For instance, the vertical posts 20 may prevent light emitted by one LED 12 from reaching a neighboring LED 12 and/or from passing through the opening 21 related to a neighboring LED 12.

FIG. 2 shows also some example dimensions of the LED device 10. For instance, a distance between vertical posts 20 of the conductive structure 15 in a cross-section may be between 2-4 µm, particularly about 3 µm (see left side). This diameter may be equal to the LED pixel pitch. A size (width or diameter d) of an opening 21 in the conductive structure 15 may be below 2 µm, or below or even below 500 nm. A height of the conductive structure 15 may be between 1-3 µm, particularly about 2 µm. This height may be in the order of the LED pixel pitch. Generally speaking, the conductive structure 15 may have a height between 0.5-0.8 times the LED pixel pitch of the LED array 11. Further, a vertical thickness of the LEDs 12 may be between 100-300 nm, particularly may be about 200 nm as shown in FIG. 2. The LEDs 12 may be GaN-based LEDs. A vertical thickness of the top contact 13 may be between 50-150 nm, particularly about 100 nm as shown in FIG. 2.

FIG. 2 also shows that each bottom contact 14 may include a contact layer 25, e.g. a highly-doped p-type semiconductor material, which is applied to the bottom surface of one of the LEDs 12. The contact layer 25 may also function as mirror (as indicated in FIG. 2), in order to support directing the light of the LED 12 along the main emission axis 18. Further, each bottom contact 14 may include an electrical connection element, e.g. a via 28, electrically connected to a CMOS IC 22 arranged below the LED array 11. That is, the LED device 10 may comprise the CMOS IC 22, which is connected through the bottom contacts 14 to the LEDs 12, and is configured to drive and/or readout the LED array 11. Thereby, each LED 12 can be driven/read out individually by means of one of the bottom contacts 14 and one or more top contacts 13. To this end, the at least one top contact 13 may be connected by at least one electrical connection element, particularly a via, to the CMOS IC 22. Thereby, the at least one electrical connection element is passed by or around the LED array 11, i.e. the electrical connection element does not go through the LED array 11. In other words, in a top view of the LED array 11, the electrical connection element would be arranged outside/ next to the LED array 11.

Figure 3:
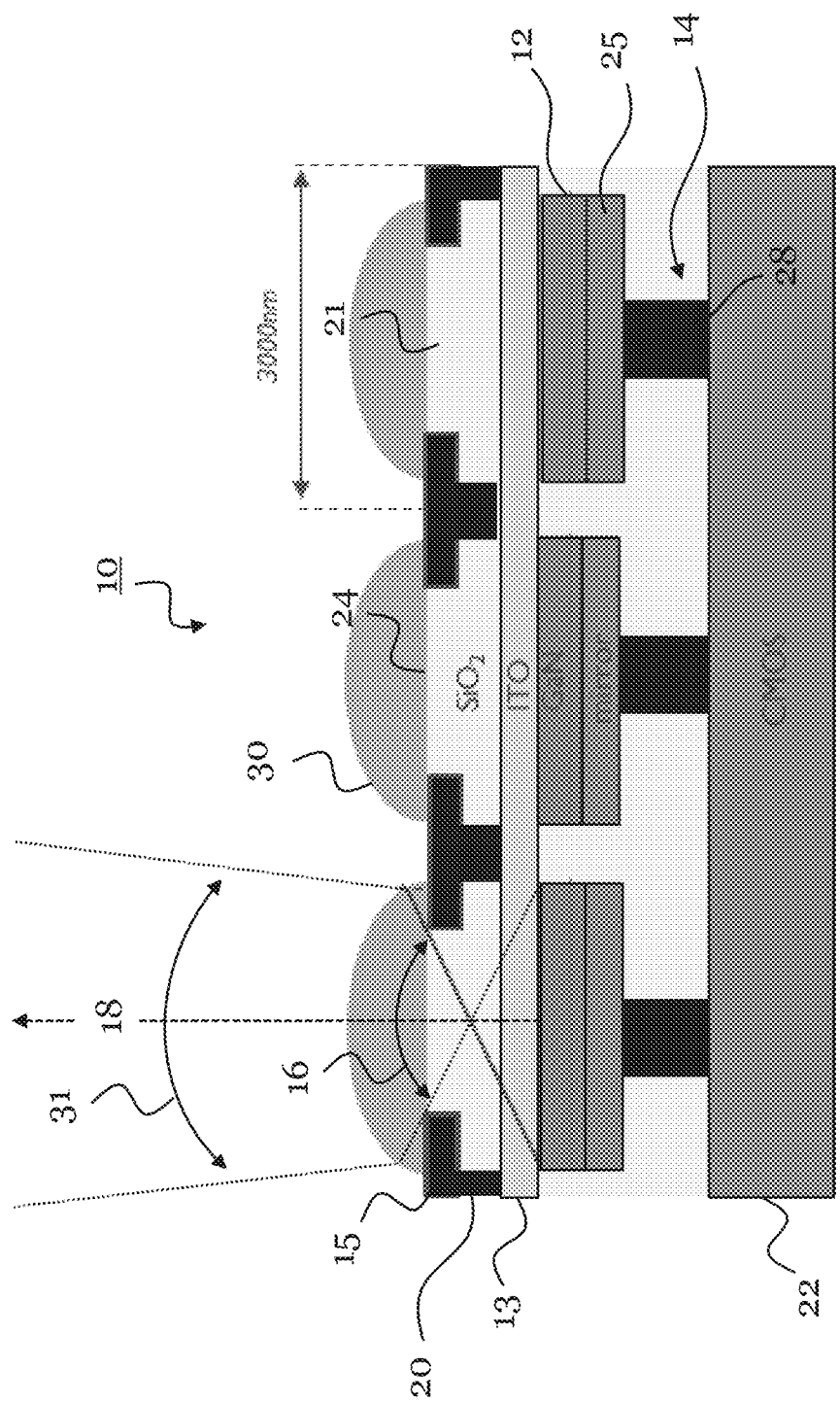
FIG. 3 shows a LED device according to an example embodiment. As an example, the embodiment can include a LED device, which includes the conductive structure in combination with a plurality of lenses disposed above the conductive structure.

FIG. 3 shows an LED device 10 according to an example embodiment, which builds on the LED device 10 shown in FIG. 1 and particularly FIG. 2. Same elements in FIG. 3 and in FIG. 1 or FIG. 2 share the same reference signs and function likewise. Also the LED device 10 of FIG. 2 comprises the LED array 11, the top and bottom contacts 13 and 14, and the conductive structure 15.

In the LED device 10 shown in FIG. 3, the conductive structure 15 is combined with a plurality of lenses 30, particularly with micro-lenses, e.g. polymer reflow lenses. Each of the lenses 30 is arranged above the conductive structure 15, particularly above an opening 21 of the conductive structure 15. Each lens 30 may cover one of the opening 21. Each of the lenses 30 is further configured to focus the light that is emitted by one of the LEDs 12 and is passed by the conductive structure 15, in this case through the associated opening 21. An advantage over the LED device 10 shown in FIG. 2 is that the conductive structure 15, which acts as the diaphragm, can be constructed less tightly, i.e. with wider openings 21, therefore resulting in a wider emission angle 16 of the passed light compared to the one achieved in FIG. 1 or 2. However, the lenses 30 focus the light again to a narrower beam, i.e. the focused light may have an emission angle 31 that is smaller than the emission angle 16 of the passed light. The emission angle 31 of the focused light may, for instance, be an angle below 60°, particularly an angle between 40-50°, i.e. it may be the same as the emission angle 16 of the passed light for the LED device 10 of FIG. 1 or FIG. 2.

Figure 4:
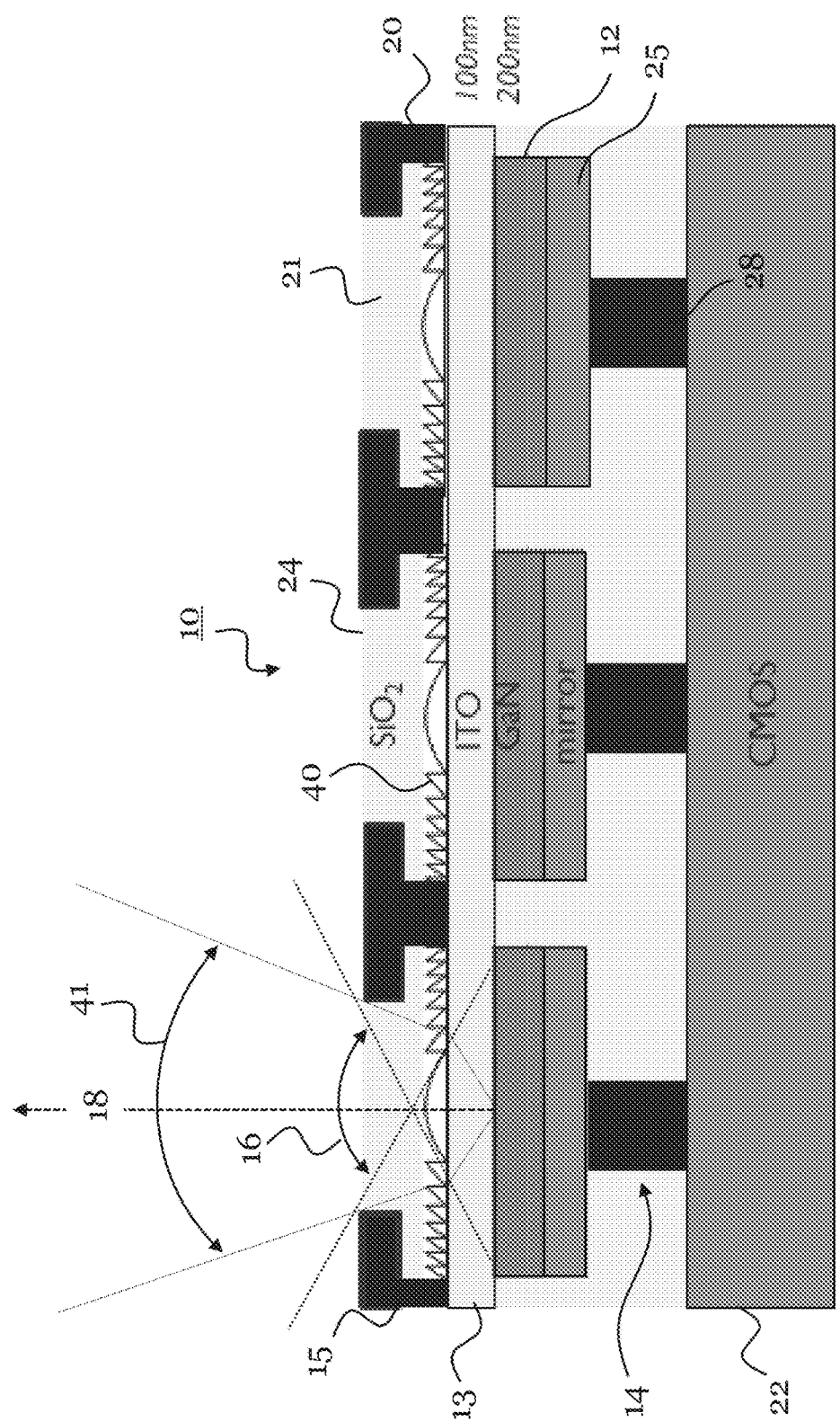
FIG. 4 shows a LED device according to an example embodiment. As an example, the embodiment can include a LED device, which includes the conductive structure in combination with a plurality of lenses disposed between the conductive structure and the LED array.

FIG. 4 shows an LED device 10 according to an example embodiment, which builds on the LED device shown in FIG. 1 and particularly FIG. 2. The LED device 10 of FIG. 4 is primarily an alternative to the LED device 10 shown in FIG. 3, but the two embodiments can also be combined. Same elements in FIG. 4 and in FIG. 1 or FIG. 2 share the same reference signs and function likewise. Also the LED device 10 of FIG. 2 comprises the LED array 11, the top and bottom contacts 13 and 14, and the conductive structure 15.

In the LED device 10 of FIG. 4, a plurality of lenses 40 are arranged between the LED array 11 and the conductive structure 15. Each of the lenses 40 is e.g. configured to focus at least some of the light emitted by one of the plurality of LEDs 12, which would be absorbed by the conductive structure 15 without the lens 40 being present. The focused light may be passed by the conductive structure 15. The plurality of lenses 40 may be refractive lenses or gratings. The lenses 40 may be arranged below the conductive structure 15 and/or within the conductive structure 15. The lenses 40 may be combined with the lenses 30 shown in FIG. 3.

An advantage over the LED device 10 shown in FIG. 2 is that the optical efficiency improves, since the intensity of the passed light is increased. In the LED device 10 of FIG. 2, light that is emitted by each LED 12 and impinges on the conductive structure 15—and is thus not transmitted through the conductive structure 15—is simply filtered out (i.e. absorbed). In the LED device 10 of FIG. 4, however, some of that light may be focused and transmitted through the conductive structure 15. Thus, in total more light may be passed by the conductive structure 15. That is, in the LED device 10 of FIG. 4, the intensity of the passed light with the emission angle 16 can be increased. For instance, an emission angle 41 of the light focused by the lenses 40 may be smaller than the emission angle 16 of the passed light.

In each of the above-described LED devices 10 according to example embodiments (shown in FIG. 1-4) a dielectric 24 surrounding the conductive structure 15, i.e. a dielectric 24 that may result from using a damascene process, may be one of e.g. $SiO_2$, SiN, aSi or $TiO_2$. The high refractive index layer 26 provided on the core 27 of the conductive structure 15—as an alternative to a carbon layer—in order to make the conductive structure 15 absorptive for the LED light, may e.g. be $Al_2O_3$ or TiO. The high refractive index layer 26 may, for instance, be deposited by Atomic Layer Deposition (ALD), in order to create a reflector configured to trap light in between the conductive core 27 of the conductive structure 15, e.g. Cu core, and the dielectric interface.

Figure 5:
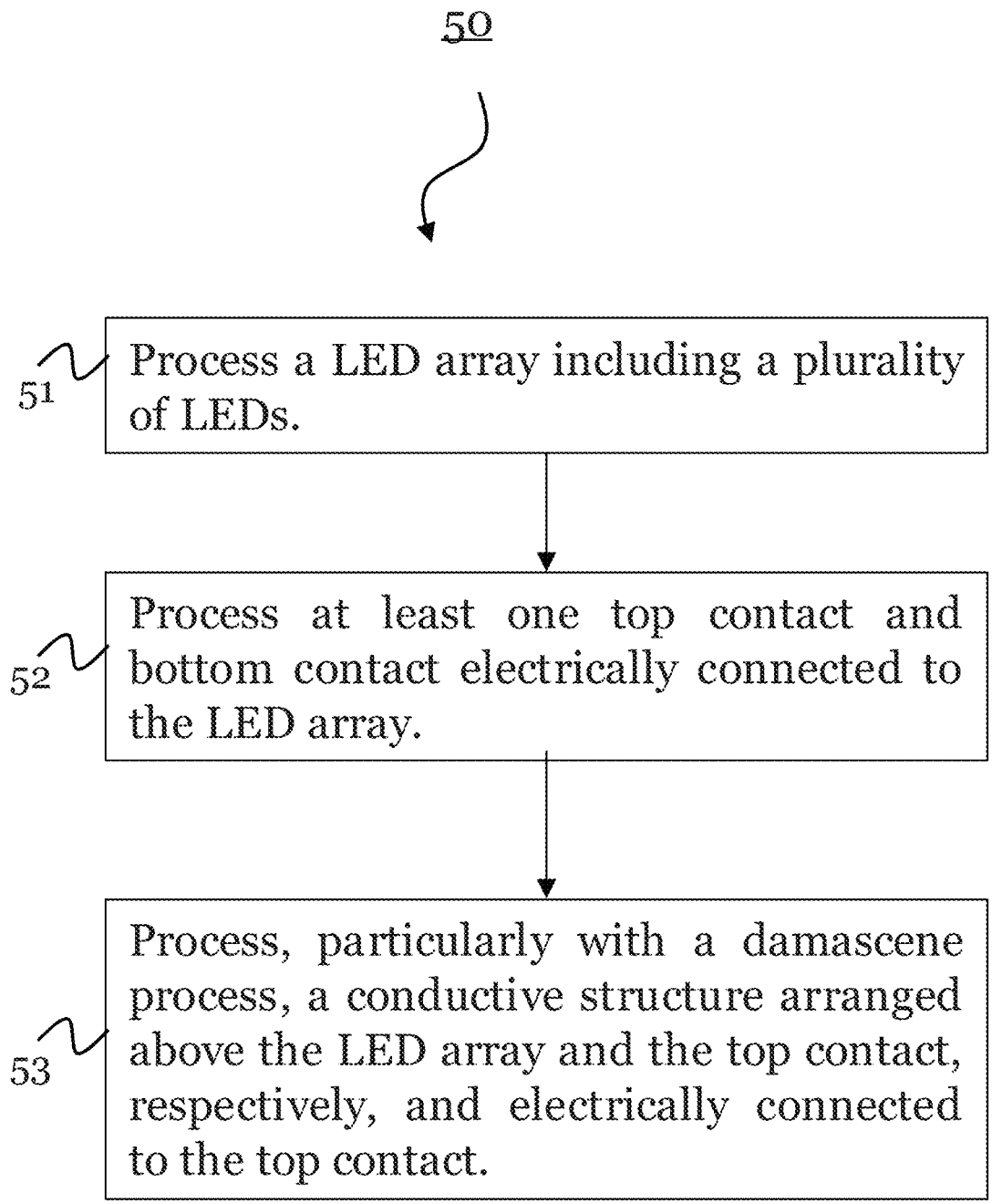
FIG. 5 shows a method according to an example embodiment for producing an LED device.

FIG. 5 shows a method 50 for fabricating an LED device 10 according to an example embodiment. For instance, the LED devices 10 shown in FIG. 1-4 can be fabricated by using this method 50. The method 50 includes a step 51 of processing a LED array 11 including a plurality of LEDs 12. Further, it includes a step 52 of processing at least one top contact 13 and at least one bottom contact 14 electrically connected to the LED array 11. Further, it includes a step 53 of processing, particularly by using a damascene process, e.g. using a dual-damascene Cu process, a conductive structure 15 arranged above the LED array 11 and the top contact 13, respectively, and electrically connected to the top contact 13. The conductive structure 15 is processed such that it is, regarding each LED 12, configured to absorb a first part of the light emitted by the LED 12, and to pass a second part of the light. Thereby, the conductive structure 15 is processed such that, in operation of the fabricated LED device 100, an emission angle 16 of the passed light is smaller than an emission angle 17 of the light emitted by the LED 12.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A Light Emitting Diode, LED, device, comprising:
   a LED array including a plurality of LEDs,
   at least one top contact and bottom contact electrically connected to the LED array, a conductive structure arranged above the LED array and the top contact, respectively, and electrically connected to the top contact, and a plurality of lenses arranged between the LED array and the conductive structure, wherein each lens is configured to focus at least some light emitted by one of the plurality of LEDs, so that the focused light is passed by the conductive structure, wherein the conductive structure is, regarding each LED, configured to absorb a first part of the light emitted by the LED, and to pass a second part of the light emitted by the LED, and wherein an emission angle of the passed light is smaller than an emission angle of the light emitted by the LED.

2. The LED device according to claim 1, wherein the emission angle of the passed light is an angle of 60° or less.

3. The LED device according to claim 2, wherein the emission angle of the passed light is an angle of 40-50°.

4. The LED device according to claim 1, further comprising:

a plurality of lenses arranged above the conductive structure, wherein each lens is configured to focus the light that is emitted by one of the plurality of LEDs and is passed by the conductive structure.

5. The LED device according to claim 4, wherein the top contact includes a transparent top contact connected to several or each of the plurality of LEDs and arranged between the LED array and the conductive structure.

6. The LED device according to claim 1, wherein the top contact includes a transparent top contact connected to several or each of the plurality of LEDs and arranged between the LED array and the conductive structure.

7. The LED device according to claim 1, wherein the conductive structure comprises a light-absorbing layer to absorb light emitted by the plurality of LEDs, and optionally, wherein the light-absorbing layer includes a carbon layer or a layer of a high refractive index material.

8. The LED device according to claim 7, wherein the top contact includes a transparent top contact connected to several or each of the plurality of LEDs and arranged between the LED array and the conductive structure.

9. The LED device according to claim 8, wherein the conductive structure is connected to regions of a top surface of the top contact, the regions being positioned above spaces between adjacent LEDs.

10. The LED device according to claim 1, wherein the conductive structure comprises a plurality of transparent openings, each transparent opening being related to one of the plurality of LEDs.

11. The LED device according to claim 10, wherein the conductive structure comprises a plurality of vertical posts, the vertical posts being positioned above spaces between the plurality of LEDs and configured to separate adjacent LEDs from each other.

12. The LED device according to claim 10, wherein an upper surface of the conductive structure defines the transparent openings and is located above the LED array.

13. The LED device according to claim 1, wherein the LED array has a LED pixel pitch between 1-10 μm and/or a height of the conductive structure is between 0.1-1 times a LED pixel pitch of the LED array.

14. The LED device according to claim 13, wherein the LED pixel pitch is equal to or below 3 μm and/or the height of the conductive structure is between 0.5-0.8 times the LED pixel pitch of the LED array.

15. The LED device according to claim 1, wherein the conductive structure comprises a metallic core, and optionally, wherein the metallic core includes a copper core and is embedded in a dielectric material.

16. The LED device according to claim 1, further comprising:

a plurality of bottom contacts, wherein each bottom contact is electrically connected to one of the plurality of LEDs, and a Complementary Metal-Oxide-Semiconductor, CMOS, integrated circuit, IC, connected through the bottom contacts to the LEDs and configured to drive the LED array.

17. The LED device according to claim 1, wherein the LED device is an integrated LED chip or wafer, and optionally, wherein the LED array, the at least one top contact and bottom contact and the conductive structure are integrated.

18. A method for fabricating a Light Emitting Diode, LED, device, the method comprising:

processing a LED array including a plurality of LEDs, processing at least one top contact and bottom contact electrically connected to the LED array, processing, with a damascene process, a conductive structure arranged above the LED array and the top contact, respectively, and electrically connected to the top contact, and processing a plurality of lenses arranged between the LED array and the conductive structure, wherein each lens is configured to focus at least some light emitted by one of the plurality of LEDs, so that the focused light is passed by the conductive structure, wherein the conductive structure is, regarding each LED, configured to absorb a first part of the light emitted by the LED, and to pass a second part of the light emitted by the LED, and wherein an emission angle of the passed light is smaller than an emission angle of the light emitted by the LED.

* * * * *